United States Patent
Anaxagoras (10) Patent No.: US 10,298,860 B2
(45) Date of Patent: May 21, 2019

(54) RADIATION DETECTION DEVICES AND METHODS

(71) Applicant: ISDI Limited, Oxford (GB)

(72) Inventor: Thalis Anaxagoras, Oxford (GB)

(73) Assignee: ISDI Limited, Oxford, Oxfordshire (GB)

( * ) Notice: Subject to any disclaimer, the term of this patent is extended or adjusted under 35 U.S.C. 154(b) by 23 days.

(21) Appl. No.: 15/307,226

(22) PCT Filed: Apr. 29, 2015

(86) PCT No.: PCT/GB2015/051245
§ 371 (c)(1),
(2) Date: Oct. 27, 2016

(87) PCT Pub. No.: WO2015/166238
PCT Pub. Date: Nov. 5, 2015

(65) Prior Publication Data
US 2017/0048471 A1   Feb. 16, 2017

(30) Foreign Application Priority Data
Apr. 29, 2014 (GB) .................................. 1407552.7

(51) Int. Cl.
*H04N 3/14* (2006.01)
*H04N 5/335* (2011.01)
(Continued)

(52) U.S. Cl.
CPC ..... *H04N 5/3559* (2013.01); *H01L 27/14607* (2013.01); *H01L 27/14609* (2013.01);
(Continued)

(58) Field of Classification Search
CPC ........ H01L 27/14607; H01L 27/14609; H04N 5/3559; H04N 5/37452; H04N 5/376; H04N 5/378
(Continued)

(56) References Cited

U.S. PATENT DOCUMENTS 4,839,735 A   6/1989   Kyomasu et al.
5,714,753 A   2/1998   Park
(Continued)

FOREIGN PATENT DOCUMENTS

CN   102752559 A   10/2012
EP   1 154 310 A2   11/2001
(Continued)

OTHER PUBLICATIONS

International Search Report corresponding with International Patent Application No. PCT/GB2012/050316; Date of Mailing of the International Search Report dated Sep. 19, 2012; 6 Pages.
(Continued)

*Primary Examiner* — Ngoc Yen T Vu
(74) *Attorney, Agent, or Firm* — Myers Bigel, P.A.

(57) ABSTRACT

Embodiments of the present invention provide a detector comprising at least one detector element, the at least one detector element comprising: a photodiode element operable to generate charge carriers, the detector being configured to generate a signal indicative of a cumulative amount of charge carriers generated by the photodiode element during the integration period; a reset switch element configured to couple the photodiode element to a reset potential; at least one charge storage reservoir; and at least one gain control switch element configured to couple at least one said at least one charge storage reservoir to the photodiode element, wherein the detector is configured to perform a reset operation in which the reset switch element and at least one said
(Continued)

at least one gain control switch element are closed in order to couple at least one said at least one charge storage reservoir and the photodiode element to the reset potential, the detector being configured to open at least one gain control switch element following a reset operation in dependence on whether at least one charge storage reservoir is to remain connected to the photodiode element during the integration period.

9 Claims, 9 Drawing Sheets

(51) Int. Cl.
  *H04N 5/355* (2011.01)
  *H01L 27/146* (2006.01)
  *H04N 5/3745* (2011.01)
  *H04N 5/378* (2011.01)
  *H04N 5/32* (2006.01)

(52) U.S. Cl.
  CPC ......... *H04N 5/378* (2013.01); *H04N 5/37452* (2013.01); *H04N 5/32* (2013.01)

(58) Field of Classification Search
  USPC .................................. 349/296–297, 308–310
  See application file for complete search history.

(56) References Cited

U.S. PATENT DOCUMENTS

| | | | |
|---|---|---|---|
| 5,729,287 A | 3/1998 | Morimoto | |
| 6,043,478 A | 3/2000 | Wang | |
| 6,215,113 B1 | 4/2001 | Chen | |
| 6,369,853 B1 | 4/2002 | Merrill et al. | |
| 6,410,899 B1 | 6/2002 | Merrill et al. | |
| 6,697,114 B1 | 2/2004 | Merrill | |
| 6,809,768 B1 | 10/2004 | Merrill | |
| 6,831,692 B1 | 12/2004 | Oda | |
| 7,518,645 B2 * | 4/2009 | Farrier | H01L 27/14603 250/208.1 |
| 8,319,307 B1 | 11/2012 | Williams | |
| 8,575,533 B2 * | 11/2013 | Yen | H01L 27/14609 250/208.1 |
| 9,167,182 B2 * | 10/2015 | Parks | H04N 5/37452 |
| 9,739,660 B2 * | 8/2017 | Suh | G01J 1/44 |
| 2002/0196352 A1 | 12/2002 | Boemler | |
| 2004/0012834 A1 | 1/2004 | Schwarte | |
| 2004/0041077 A1 | 3/2004 | Fossum | |
| 2004/0046883 A1 | 3/2004 | Suzuki | |
| 2004/0096124 A1 | 5/2004 | Nakamura | |
| 2004/0108564 A1 | 6/2004 | Mitra | |
| 2004/0223065 A1 | 11/2004 | Takayanagi | |
| 2004/0251394 A1 | 12/2004 | Rhodes et al. | |
| 2005/0110093 A1 | 5/2005 | Altice, Jr. et al. | |
| 2006/0011807 A1 | 1/2006 | Lee et al. | |
| 2006/0050352 A1 | 3/2006 | Schwarte | |
| 2006/0146159 A1 | 7/2006 | Farrier | |
| 2006/0181626 A1 | 8/2006 | Lee | |
| 2006/0231875 A1 | 10/2006 | Patrick et al. | |
| 2006/0255380 A1 | 11/2006 | Lee | |
| 2007/0023798 A1 | 2/2007 | McKee | |
| 2007/0035649 A1 * | 2/2007 | McKee | H01L 27/14609 348/308 |
| 2007/0063299 A1 | 3/2007 | Hwang | |
| 2007/0075338 A1 | 4/2007 | Park et al. | |
| 2007/0139740 A1 | 6/2007 | Igura et al. | |
| 2008/0164403 A1 | 7/2008 | Hall et al. | |
| 2009/0008532 A1 | 1/2009 | Setoguchi | |
| 2009/0072120 A1 | 3/2009 | McGarry et al. | |
| 2009/0114961 A1 | 5/2009 | Ki | |
| 2009/0141155 A1 | 6/2009 | Ellis-Monaghan | |
| 2009/0251576 A1 | 10/2009 | Hattori et al. | |
| 2009/0321800 A1 | 12/2009 | Ohkawa | |
| 2010/0097518 A1 | 4/2010 | Ahn | |
| 2010/0188491 A1 | 7/2010 | Shizukuishi | |
| 2010/0309352 A1 | 12/2010 | Mashiyama | |
| 2011/0134286 A1 | 6/2011 | Inoue et al. | |
| 2012/0256077 A1 | 10/2012 | Yen et al. | |
| 2013/0068955 A1 | 3/2013 | Matsuura | |

FOREIGN PATENT DOCUMENTS

| | | |
|---|---|---|
| EP | 1 233 459 A1 | 8/2002 |
| EP | 1 435 662 A2 | 7/2004 |
| EP | 1 732 134 A1 | 12/2006 |
| EP | 1 858 082 A1 | 11/2007 |
| EP | 1 887 626 A1 | 2/2008 |
| EP | 1 998 559 A1 | 12/2008 |
| EP | 2 133 918 A2 | 12/2009 |
| GB | 2 330 905 A | 5/1999 |
| GB | 2 510 372 A | 8/2014 |
| JP | 2005012007 A | 1/2005 |
| JP | 2006262387 A | 9/2006 |
| JP | 2010273383 A | 12/2010 |
| WO | WO 99/66560 A1 | 12/1999 |
| WO | WO 2005/074250 A1 | 11/2005 |
| WO | WO 2006/073875 A2 | 7/2006 |
| WO | WO 2008/156232 A1 | 12/2008 |
| WO | WO 2012/007744 A1 | 1/2012 |

OTHER PUBLICATIONS

Notification of Transmittal of the International Search Report and the Written Opinion of the International Searching Authority, or the Declaration, PCT/GB2015/051245, dated Sep. 21, 2015, 17 Pages.
Combined Search and Examination Report, GB Application No. 1407552.7, dated Sep. 10, 2014, 8 pages.

* cited by examiner

RADIATION DETECTION DEVICES AND METHODS

RELATED APPLICATIONS

This application is a 35 U.S.C. § 371 national stage application of PCT Application No. PCT/GB2015/051245, filed on Apr. 29, 2015, which claims priority from Great Britain Patent Application No. 1407552.7, filed Apr. 29, 2014, the contents of which are incorporated herein by reference in their entireties. The above-referenced PCT International Application was published in the English language as International Publication No. WO 2015/166238 A1 on Nov. 5, 2015.

TECHNICAL FIELD

The present invention relates to radiation detectors. In particular but not exclusively the invention relates to radiation detectors fabricated in silicon by means of CMOS wafer processing technologies.

BACKGROUND

It is known to provide an imaging device having a radiation detector in the form of a two dimensional array of pixels or pixel elements, each pixel element having a radiation sensor element for detecting radiation incident thereon. An image of a subject may be obtained by the device by projecting radiation onto the detector and determining the relative amounts of radiation incident upon each pixel element over a prescribed time period.

Known detectors include CMOS (complementary metal oxide semiconductor) detectors, CCD (charge coupled device) detectors, image intensifiers and the like. CMOS and CCD detectors are commonly used in domestic hand-held electronic devices such as mobile telephones and video cameras.

Such devices also find application in scientific instrumentation apparatus such as medical imaging systems, electron microscopes including transmission electron microscopes, medical and biological imaging applications, space imaging applications and security applications.

The problem exists that the dynamic range of known detectors is limited. As a consequence, images captured using known detectors frequently suffer the problem that certain regions are underexposed, resulting in relatively high signal to noise ratio, whilst some regions are overexposed, resulting in saturation of the detector. It is desirable to provide a detector having improved dynamic range so that the problem that certain regions are underexposed and other regions are overexposed is reduced or substantially eliminated.

FIG. 1 is a schematic circuit diagram of a known CMOS active pixel element 110. The pixel element 110 has a radiation sensor element in the form of a photodiode 110PD and three MOS transistors: a reset transistor 121, a source-follower input transistor 131 and a selection ('select') transistor 141. Source-follower input transistor 131 forms a source follower arrangement with current bias portion 150 which comprises a current mirror arrangement. The source-follower input transistor 131 may also be referred to as a source follower transistor 131.

Each of the transistors 121, 131, 141 has a source, a gate, a drain and a bulk terminal (not shown). In the case that NMOS transistors are employed the bulk terminal may be connected to the common substrate, in the case that PMOS transistors are employed the bulk terminal may be connected to a substantially fixed potential. In some embodiments the bulk terminal may be connected to the source terminal.

The source of the reset transistor 121 is connected to a node X whilst the drain is connected to a supply of potential $V_{RST}$. The gate of the reset transistor 121 is connected to a reset signal line RST. The gate, source and drain of the source-follower input transistor 131 are respectively connected to node X, the drain of the selection transistor 141 and a supply of reference voltage $V_{DD}$. The gate of the selection transistor 141 is connected to a row select line ROW and the source of the selection transistor 141 is connected to a column readout line COL.

It is to be understood that the source-follower input transistor 131 is arranged to act as a buffer of the signal applied to the gate thereof. When the current flow through the source-follower input transistor 131 is kept constant by an appropriate bias applied by the current bias portion 150 then, neglecting the second order effect of the activated selection transistor 141, the output voltage on the column readout line COL at terminal T is proportional to the potential applied to the gate of the source-follower input transistor 131 but with a much lower equivalent output impedance.

In operation, reset signal line RST is set HIGH (i.e. assumes a logical 1 condition) causing the reset transistor 121 to turn ON (i.e. the channel of the reset transistor 121 becomes conducting) and a potential $V_x$ of the floating node 'X' is set substantially to reset potential $V_{RST}$. When the potential at $V_x$ is set to $V_{RST}$, the photodiode 110PD stores charge therein due to the node capacitance of the photodiode 110, a region of space charge associated with the photodiode 110 being increased.

The reset signal line RST is then set LOW (i.e. controlled to assume a logical 0 condition) causing reset transistor 121 to turn OFF.

Radiation incident on the diode 110PD is converted to mobile electron-hole pairs within the diode 110PD causing a current to flow through the diode, discharging the charge accumulated by the photodiode 110PD when the reset signal was applied. This in turn causes a change in $V_x$.

When it is required to read out $V_x$ the row of the pixel element 110 of FIG. 1 is selected by turning ON the selection transistor 141 (i.e. row line ROW is set HIGH). A signal corresponding to $V_x$ is then applied by the selection transistor 141 to the column line COL which may also be referred to as an output line OUT. The column line COL is in turn connected to a sample-and-hold circuit 160 which presents the potential applied to the column line COL at an output terminal T of the column line COL. The period between application of the reset signal to the photodiode 110PD and the next readout of the potential at node X (when row line ROW is set HIGH) will be referred to herein as the integration period.

At the end of the integration period, following readout of the potential at node X, reset signal line RST is again set HIGH. As discussed above, this has the effect of setting the potential at floating node X to $V_{RST}$ via reset transistor 121, removing charge accumulated by the photodiode 110PD into its node capacitance during the integration period.

Applying $V_{RST}$ to the diode 110PD biases the diode 110PD and therefore $V_{RST}$ may be referred to as a bias voltage. In the embodiment of FIG. 1 $V_{RST}$ is arranged to reverse bias the diode 110PD to increase the width of the depletion layer and improve detection response time.

It is to be understood that in the arrangement of FIG. 1 $V_x$ is monotonically dependant on the cumulative number of photo-generated electrons collected by the diode 110PD, which is in turn typically monotonically dependant on the level of illumination, specifically the illuminance (the total incident luminous flux, per unit area).

When the amount of accumulated charge at the diode 110PD falls to a sufficiently low value $V_x$ ceases to change with further illumination and the diode 110PD may be considered to be 'saturated'.

It is to be understood that the amount of charge accumulated by the diode 110PD before reaching saturation depends on the node capacitance of the diode 110PD. The larger the node capacitance, the more charge can be accumulated by the diode 110PD before saturation conditions are reached, and the greater the dynamic range (saturation level) of the pixel element 110. However, increasing the node capacitance causes an increase in the sampling noise (reset noise on node X) in the output signal of the pixel element 110 (i.e. the total potential read out at column line COL), reducing the signal to noise ratio (SNR) for relatively small signal levels. It is to be understood that at higher signal levels photon noise (shot noise) may dominate. In the pixel element 110 shown in FIG. 1 a trade-off is made between dynamic range and noise.

In order to increase the dynamic range (saturation level) of the pixel element 110, the element 110 has a switch element 125 coupled to node X which is configured to connect a capacitor device 125C in parallel with the photodiode 110PD when the switch is closed. The switch element 125 may also be referred to as a gain control switch device.

In use, when it is required to increase the dynamic range of the pixel element, the gain control switch 125 is closed. When a reset operation is performed in which the potential at node X is set to $V_{RST}$, the capacitor 125C accumulates charge together with the photodiode 110PD. Since the capacitance associated with node X is increased, the rate of change of the potential at node X as a function of incident illumination is reduced relative to that when gain control switch 125 is open.

Figure 1A:
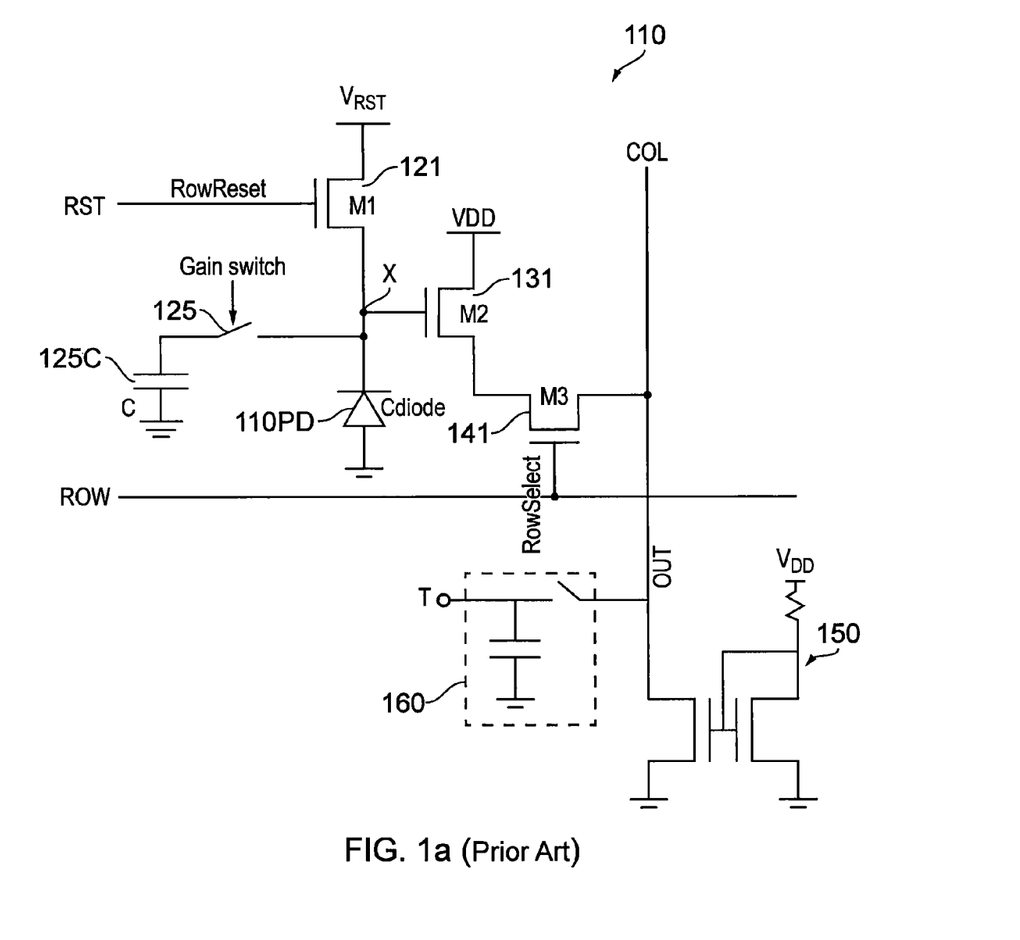
Figure 1B:
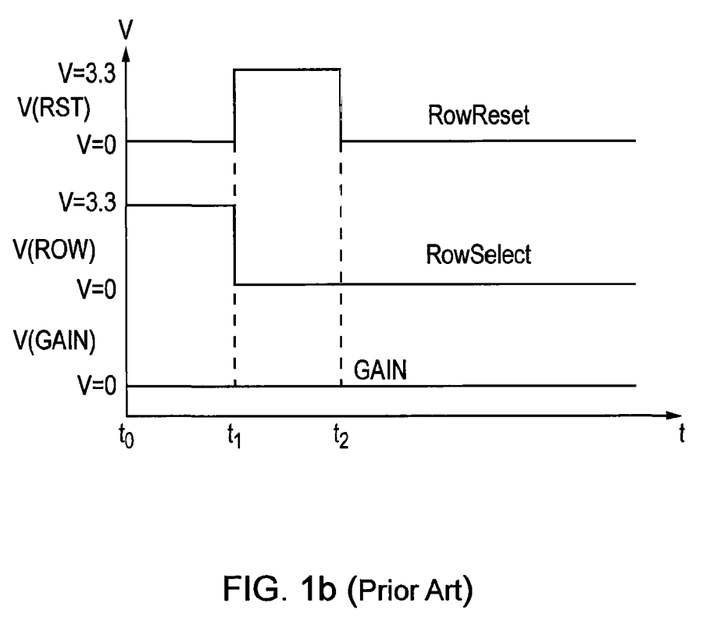

FIG. 1(b) is a signal timing diagram illustrating the application of control signals to the pixel element 110 of FIG. 1(a) in a high gain mode of operation of the element 110 in which gain control switch 125 remains open such that capacitor 125C is not connected across photodiode 110PD.

At time t=t0 the row select signal line ROW is set high and the potential at node X is read out to column line COL. The sample-and-hold circuit 160 samples the potential of the column line COL and maintains output terminal T at this potential whilst readout electronics (not shown) converts this potential to corresponding digital data. Once the potential at node X has been clocked by sample-and-hold circuit 160, at time t1 row select signal line ROW is set low. Also at time t1, row reset line RST is set high and node X is set to the reset potential $V_{RST}$. Subsequently, at time t2, the potential of row reset line RST is set low, and reset transistor 121 resumes the open condition or state.

Typically the gain control switch 125 is in the form of a transistor device. The present inventors have recognised that in this case, node X has two transistor drains/sources connected to it. Accordingly, two current leak paths exist when the reset transistor 121 and gain switch transistor are in an open condition. The present inventors have identified that this adversely affects one or more characteristics of a detector device having an array of pixel elements 110.

It is desirable to improve the performance of pixel elements used in detector devices.

Embodiments of the present invention endeavour to mitigate at least one of the disadvantages of known radiation detectors.

It is an aim of the present invention to address disadvantages associated with the prior art.

SUMMARY OF THE INVENTION

Embodiments of the invention may be understood with reference to the appended claims.

Aspects of the present invention provide apparatus, a system and a method.

In one aspect of the invention for which protection is sought there is provided a detector comprising at least one detector element, the at least one detector element comprising:

a photodiode element operable to generate charge carriers, the detector being configured to generate a signal indicative of a cumulative amount of charge carriers generated by the photodiode element during the integration period;

a reset switch element configured to couple the photodiode element to a reset potential;

at least one charge storage reservoir; and at least one gain control switch element configured to couple at least one said at least one charge storage reservoir to the photodiode element, wherein the detector is configured to perform a reset operation in which the reset switch element and at least one said at least one gain control switch element are closed in order to couple at least one said at least one charge storage reservoir and the photodiode element to the reset potential, the detector being configured to open at least one said at least one gain control switch element following a reset operation in dependence on whether the corresponding charge storage reservoir is to remain connected to the photodiode element during the integration period.

In an aspect of the invention for which protection is sought there is provided a detector comprising at least one detector element, the at least one detector element comprising:

a photodiode element operable to generate charge carriers, the detector being configured to generate a signal indicative of a cumulative amount of charge carriers generated by the photodiode element during an integration period;

a reset switch element configured to couple the photodiode element to a reset potential;

at least one charge storage reservoir; and at least one gain control switch element configured to couple at least one said at least one charge storage reservoir to the photodiode element, wherein the detector is configured to perform a reset operation in which the reset switch element and at least one said at least one gain control switch element are closed in order to couple at least one said at least one charge storage reservoir and the photodiode element to the reset potential, the detector being configured to open at least one gain control switch element following a reset operation in dependence on whether at least one charge storage reservoir is to remain connected to the photodiode element during the integration period.

A detector comprising at least one detector element, the at least one detector element comprising:

a photodiode element operable to collect charge carriers in response to incident radiation, the detector being configured to generate a signal indicative of a cumulative amount of charge carriers generated by the photodiode element during an integration period;

a reset switch element configured to couple the photodiode element to a reset potential;

a charge storage reservoir; and a gain control switch element configured to couple the charge storage reservoir to the photodiode element, wherein the detector is configured to perform a reset operation in which the reset switch element and the gain control switch element are closed in order to couple the charge storage reservoir and the photodiode element to the reset potential, the detector being configured to open the gain control switch element following a reset operation in dependence on whether the charge storage reservoir is to remain connected to the photodiode element during the integration period.

In a further aspect of the invention for which protection is sought there is provided a detector comprising at least one detector element, the at least one detector element comprising:

a photodiode element operable to generate charge carriers in response to incident radiation, the detector being configured to generate a signal indicative of a cumulative amount of charge carriers generated by the photodiode element during an integration period;

a reset switch element configured to couple the photodiode element to a reset potential;

a charge storage reservoir; and a gain control switch element configured to couple the charge storage reservoir to the photodiode element, wherein the detector is configured to perform a reset operation in which the reset switch element and the gain control switch element are closed in order to couple the charge storage reservoir and the photodiode element to the reset potential, the detector being configured to open the gain control switch element following a reset operation in dependence on whether the charge storage reservoir is to remain connected to the photodiode element during the integration period.

This feature has the advantage that both the charge storage reservoir and the photodiode element are connected to the reset potential when a reset operation is performed, regardless of whether the charge storage reservoir is to remain connected to the photodiode element during the integration period. Accordingly, if the gain control switch element is opened following the reset operation and remains open during the integration period, a potential difference across the gain control switch element is reduced, at least at the start of the integration period, compared with prior art detectors. Consequently, leakage of charge across the gain control switch element to or from the diode device may be reduced, increasing a correspondence between a cumulative amount of radiation incident on the diode device during the integration period and a change in potential difference across the diode element during the integration period. It is to be understood that, in some embodiments, opening of the gain control switch element following a reset operation may mark the start of the integration period.

The photodiode element may be configured to generate charge carriers in response to radiation incident on the detector. The radiation may be in the form of photon radiation, alpha particle radiation, electron radiation, proton radiation, neutron radiation or any other form of radiation or incident particles. The detector may comprise a scintillator for converting incident radiation or particles into photon radiation of a predetermined wavelength or range of wavelengths, which may be detected by the photodiode element. Other arrangements may also be useful.

The gain control switch element may be provided in a flow path of current between the reset switch element and the diode device.

Alternatively the gain control switch element may be provided in a flow path of current between the photodiode element and ground potential.

The detector may comprise a plurality of gain control switch elements each having a respective charge storage reservoir associated therewith, the detector being configured to connect one or more of the charge storage reservoirs to the photodiode element via the corresponding gain control switch element.

In a circuit having a plurality of gain control switch elements, at least one may be provided in a flow path of current between the reset switch element and the diode device and at least one may be provided in a flow path of current between the photodiode element and ground potential.

The detector may be configured wherein when a reset operation is performed, a plurality of said plurality of gain control switch elements are closed in order to couple the respective charge storage reservoirs to the photodiode element and to the reset potential, the detector being configured to open one or more of the gain control switch elements following a reset operation in dependence on whether the charge storage reservoir associated with a given gain control switch element is to remain connected to the photodiode element during the integration period.

The detector may be configured wherein if any one or more gain control switch element remains open during an integration period and the detector is configured such that a current flowpath is provided between a terminal of the gain control element and the photodiode element during the integration period, the detector is configured such that said one or more gain control elements are closed during the reset operation such that a potential across the one or more gain control elements is substantially zero when the reset operation is complete and the one or more gain control elements are opened at the start of the integration period.

It is to be understood that in this context, by current flow path is meant that the circuit is configured such the detector is configured to provide an intentional current flowpath via circuit wiring or via one or more transistor devices that are in a closed state. In this context parasitic or leak flowpaths are not considered to be intentional current flowpaths.

The detector may comprise means for reading out a signal from the at least one detector element indicative of a cumulative amount of charge carriers generated by the photodiode element during the integration period.

The detector may comprise at least one readout signal line, the at least one detector element comprising a switch element configured to apply, to one said at least one readout signal line, a signal indicative of a cumulative amount of charge carriers generated by the photodiode element during the integration period.

The detector according to any preceding claim comprising a plurality of detector elements.

The detector may comprise a plurality of rows of detector elements, each row comprising a plurality of detector elements forming a corresponding plurality of columns.

Optionally, each column of detector elements may be provided with a corresponding column readout signal line, the detector elements of a given column being configured to apply to the column readout signal line a signal indicative of a cumulative amount of charge carriers generated by the photodiode element during the integration period.

It is to be understood that other arrangements may also be useful.

In one aspect of the invention for which protection is sought there is provided a detector comprising:
   a photodiode element operable to generate charge carriers in response to incident radiation, the detector being configured wherein a change in potential across the diode element during an integration period is responsive to a cumulative amount of charge carriers generated by the photodiode element during the integration period;
   a reset switch element configured to couple the photodiode element to a reset potential;
   a charge storage reservoir; and
   a gain control switch element configured to couple the charge storage reservoir to the photodiode element,
   wherein the detector is configured to perform a reset operation in which the reset switch element and the gain control switch element are closed in order to couple the charge storage reservoir and the photodiode element to the reset potential, the detector being configured to open the gain control switch element following a reset operation in dependence on whether the charge storage reservoir is to remain connected to the photodiode element during the integration period.

In a further aspect of the invention for which protection is sought there is provided a detector comprising:
   a diode element operable to generate charge carriers in response to incident radiation;
   a reset switch element configured to couple the diode element to a reset potential;
   a charge storage reservoir; and
   a gain control switch element configured to couple the charge storage reservoir to the diode element,
   wherein the gain control switch element is provided in a flow path of current between the reset switch element and the diode element.

The diode element may comprise a photodiode element.

In one aspect of the invention for which protection is sought there is provided a method of detecting radiation or particles comprising:
   generating charge carriers in a photodiode element, and generating a signal indicative of a cumulative amount of charge carriers generated by the photodiode element during the integration period; and
   performing a reset operation in which a reset switch element and a gain control switch element are closed in order to couple a charge storage reservoir and the photodiode element to a reset potential, the method comprising opening the gain control switch element following the reset operation in dependence on whether the charge storage reservoir is to remain connected to the photodiode element during the integration period.

In an aspect of the invention for which protection is sought there is provided a method of detecting radiation or particles comprising:
   generating charge carriers in a photodiode element, and generating a signal indicative of a cumulative amount of charge carriers generated by the photodiode element during the integration period; and
   performing a reset operation in which a reset switch element and at least one gain control switch element are closed in order to couple at least one charge storage reservoir and the photodiode element to a reset potential, the method comprising opening at least one said at least one gain control switch element following the reset operation in dependence on whether at least one charge storage reservoir is to remain connected to the photodiode element during the integration period.

In one aspect of the invention for which protection is sought there is provided a detector comprising at least one detector element, the at least one detector element comprising:
   a photodiode element operable to generate charge carriers in response to incident radiation, the detector being configured wherein a change in potential across the diode element during an integration period occurs responsive at least in part to a cumulative amount of charge carriers generated by the photodiode element during the integration period;
   a reset switch element configured to couple the photodiode element to a reset potential;
   a charge storage reservoir; and
   a gain control switch element configured to couple the charge storage reservoir to the photodiode element,
   wherein the detector is configured to perform a reset operation in which the reset switch element and the gain control switch element are closed in order to couple the charge storage reservoir and the photodiode element to the reset potential, the detector being configured to open the gain control switch element following a reset operation in dependence on whether the charge storage reservoir is to remain connected to the photodiode element during the integration period Within the scope of this application it is envisaged that the various aspects, embodiments, examples and alternatives, and in particular the individual features thereof, set out in the preceding paragraphs, in the claims and/or in the following description and drawings, may be taken independently or in any combination. For example features described in connection with one embodiment are applicable to all embodiments, unless such features are incompatible.

For the avoidance of doubt, it is to be understood that features described with respect to one aspect of the invention may be included within any other aspect of the invention, alone or in appropriate combination with one or more other features.

BRIEF DESCRIPTION OF THE DRAWINGS

One or more embodiments of the invention will now be described, by way of example only, with reference to the accompanying figures in which:

FIG. 1 is (a) a schematic circuit diagram of a known pixel element and (b) a corresponding signal timing diagram showing control signals generated by a control portion of a detector device incorporating the pixel element;

FIG. 2 is (a) a schematic circuit diagram of a pixel element according to an embodiment of the present invention, (b) a corresponding signal timing diagram showing control signals generated by a control portion of a detector device incorporating the pixel element, (c) a schematic diagram of a detector device according to an embodiment of the present invention, and (d) a plot of potential at node X of the circuit of (a) as a function of time in respective high and low gain modes of operation;

DETAILED DESCRIPTION

Figure 2A:
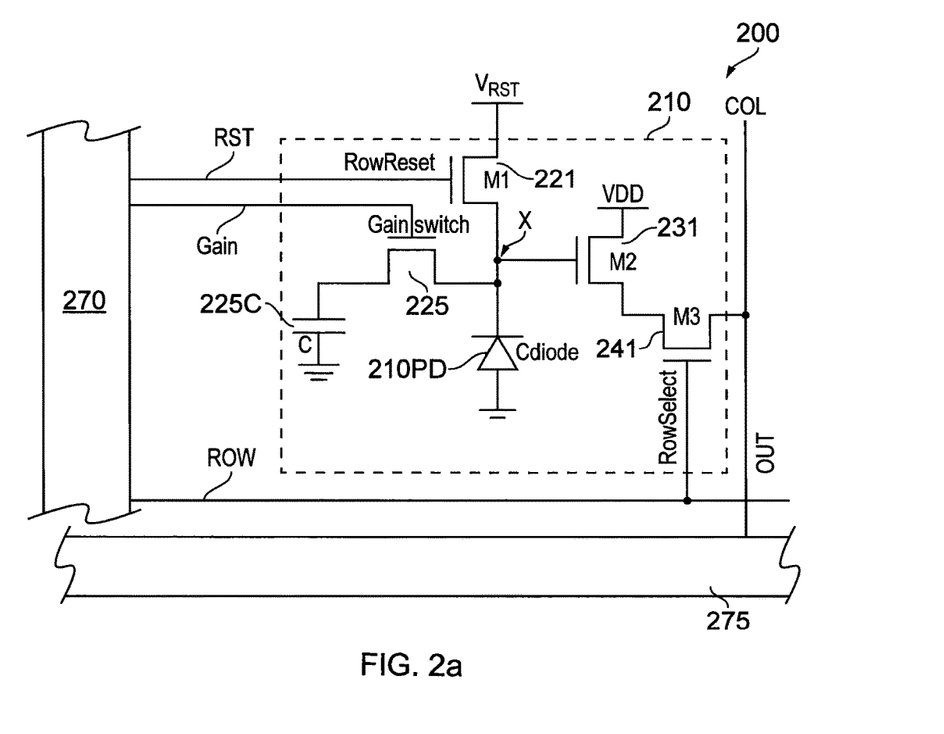
Figure 2B:
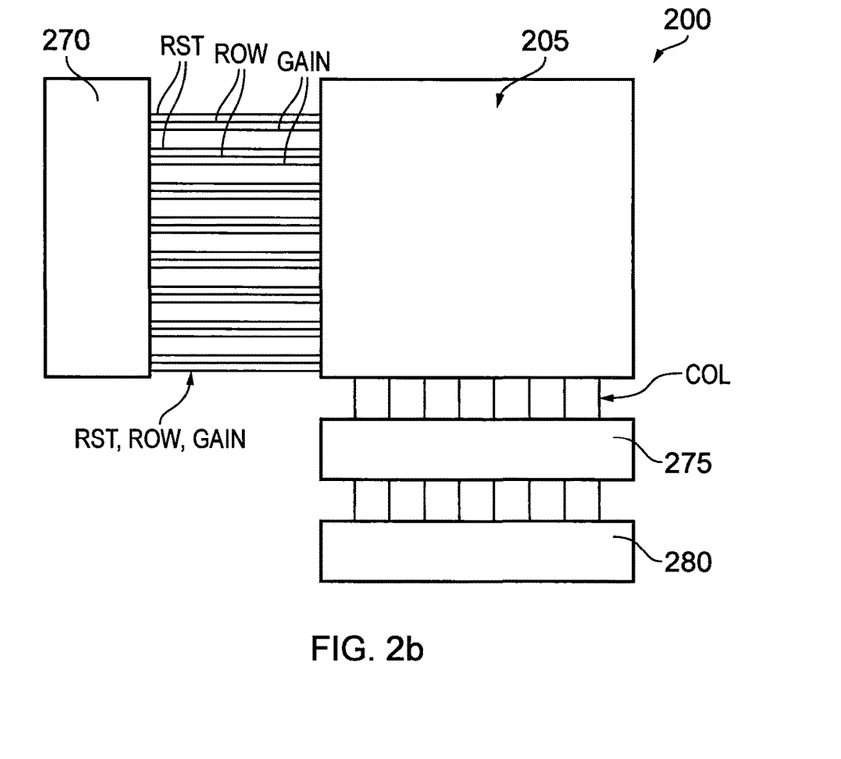
Figure 2C:
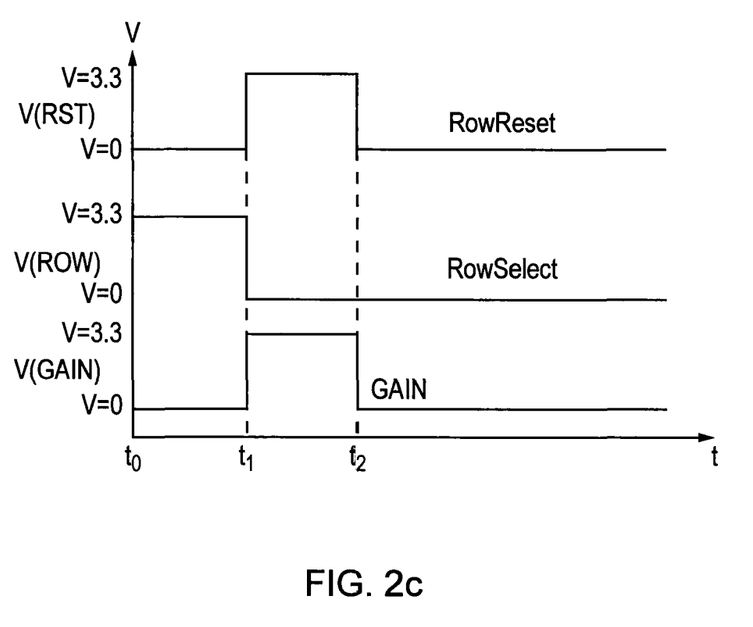

FIG. 2(a) is a schematic circuit diagram of a portion of a detector device 200 according to an embodiment of the present invention. The detector device 200 includes a pixel element 210. FIG. 2(b) is a further schematic illustration of the detector device 200. FIG. 2(c) is timing diagram associated with operation of the detector device 200.

In FIG. 2(a), like features of the pixel element 210 to those of the element 110 of FIG. 1 are shown with like reference signs prefixed numeral 2 instead of numeral 1.

As can be seen from FIG. 2(a) the pixel element 210 has a gain control transistor device 225 coupled between the photodiode 210PD and capacitor device 225C. When gain control signal line GAIN is set high, the gain control transistor device 225 closes and the potential across the capacitor device 225C is set to the potential at node X.

The pixel element 210 may be operated in a low gain mode in which gain control transistor device 225 remains closed during the integration period of operation of the pixel element 210 so that charge carriers generated by the photodiode device 210PD cause a change in potential across the capacitor device 225C as well as the photodiode device 210PD. Alternatively the pixel element 210 may be operated in a high gain mode in which gain control device 225 remains open during operation of the pixel element 210 so that charge carriers generated by the photodiode device 210PD cause a change in potential across the photodiode device 210PD and not the capacitor device 225C. The cumulative amount of radiation required to cause a given change in potential across the photodiode device 210PD is therefore lower in the high gain mode compared with the low gain mode. The low gain mode may be a relatively high noise mode compared with the high gain mode, in some embodiments.

The detector device 200 is shown further in FIG. 2(b) where it can be seen that the device 200 has an array 205 of pixel elements 210 arranged in rows and columns. Each row of pixel elements 210 is connected to a row reset signal line RST, a gain control signal line GAIN and a row select signal line ROW. A row control block 270 applies row reset signals to the row reset signal lines RST as required, gain control signals to the gain control signal lines GAIN as required, and row select signals to the row select lines ROW as required. In the present embodiment, the row reset transistor device 221, gain control transistor device 225 and row select transistor device 241 of each pixel element 210 are closed when the corresponding signal line is set high, and opened when the corresponding signal line is set low although in some embodiments one or more of the devices 221, 225, 241 may be arranged to be closed when the corresponding signal line is set low and open when set high. In the present embodiment, the detector device 200 is configured such that a signal line is considered to be set high when a potential applied thereto is in the range from 2.5 to 3.5 V and low when a potential applied thereto is less than 1.5V. Other ranges may also be useful.

Similarly, each column of pixel elements 210 is connected to a respective column readout line COL. The column readout lines COL are connected to a column readout control block 275 that reads out and stores in a respective sample-and-hold circuit the potential applied by each pixel element 220 to the corresponding column readout line COL. The potentials at an output terminal T of each sample-and-hold circuit are read by an analogue-to-digital converter control block 280 that converts the potentials to digital data.

In the present embodiment, when the pixel elements 210 of the detector device 200 are operated in the high gain mode, the row control block 270 causes the potential across the capacitor device 225C to be set to $V_{RST}$ when the potential at node X is set to $V_{RST}$ by causing the gain control signal line GAIN to be set high when the row reset signal line RST is set high. The row control block 270 causes the gain control signal line GAIN to return to the low state when the row reset signal line RST is subsequently set low.

It is to be understood that, in consequence of causing the gain control transistor device 225 to assume the closed condition when the potential at node X is reset to the potential $V_{RST}$, the potential across the gain control transistor device 225 is reduced following resetting of the potential at node X. This results in reduced leakage current through gain control transistor device 225 during the period immediately following resetting of the potential at node X. The present applicant has discovered that a surprising improvement may be enjoyed in the signal to noise ratio (SNR) of images captured using this improved method of operation of the pixel element 210.

FIG. 2(c) illustrates the sequence in which control signals may be applied to the pixel element 210 by the row control block 270 when the pixel element 210 is operated in the high gain, relatively low noise configuration in which capacitor 225C remains disconnected from the photodiode 210PD during the integration period.

At time t=t0, the row select line ROW of a given row of pixel elements 210 is set high whilst the row reset lines RST and gain control lines GAIN of the rows of the detector device 200 remain low. At time t=t1, after a predetermined period of has elapsed which in the present embodiment is approximately 10 microseconds although other values may also be useful, the row select line ROW returns low. At substantially the same time the row reset signal line RST and gain control signal line GAIN of that row are each set high for substantially the same predetermined time period of 10 microseconds although in some embodiments the predetermined period for which the RST signal line is set high may be different from that for which the GAIN signal line is set high. At time t=t2 the row reset signal line RST and gain control signal line GAIN are returned to the low state.

As discussed above, the feature that the potential across the gain control transistor device 225 is set substantially to zero when the potential at node X is reset even when the pixel element 210 is operated in the high gain, relatively low noise configuration, has the advantage that leakage of charge across the gain control transistor device 225 following a reset operation may be reduced. This in turn may have the effect of increasing the signal to noise ratio of images captured by means of the detector device 200, and/or improving a correspondence between the potential at node X and the cumulative amount of radiation incident on the photodiode 210PD since a reset operation was last performed, i.e. during the integration period.

It is to be understood that if the detector element 200 is operated in the low gain mode, the potential at signal line GAIN remains high following the reset operation when the potential at reset line RST reverts low. This is so that capacitor 225C remains connected in parallel with the photodiode 210PD, increasing the full well (saturation) of the pixel element. In some embodiments, the signal line GAIN may remain high substantially at all times when the detector element 200 is operated in the low gain mode.

Figure 2D:
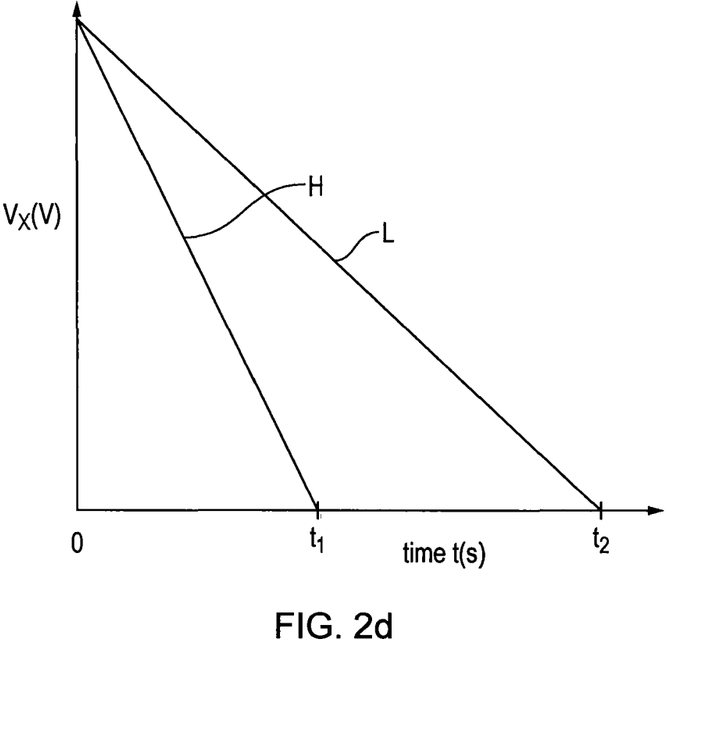

FIG. 2(d) is a plot of potential at Vx as a function of time in the high gain mode (H) and the low gain mode (L). It can be seen that the rate of change of Vx as a function of time is higher in the high gain mode compared with the low gain mode. The time taken for the pixel element to become saturated in the high gain mode (approximately t1 seconds) is clearly less than that in the low gain mode (approximately t2 seconds).

Figure 3:
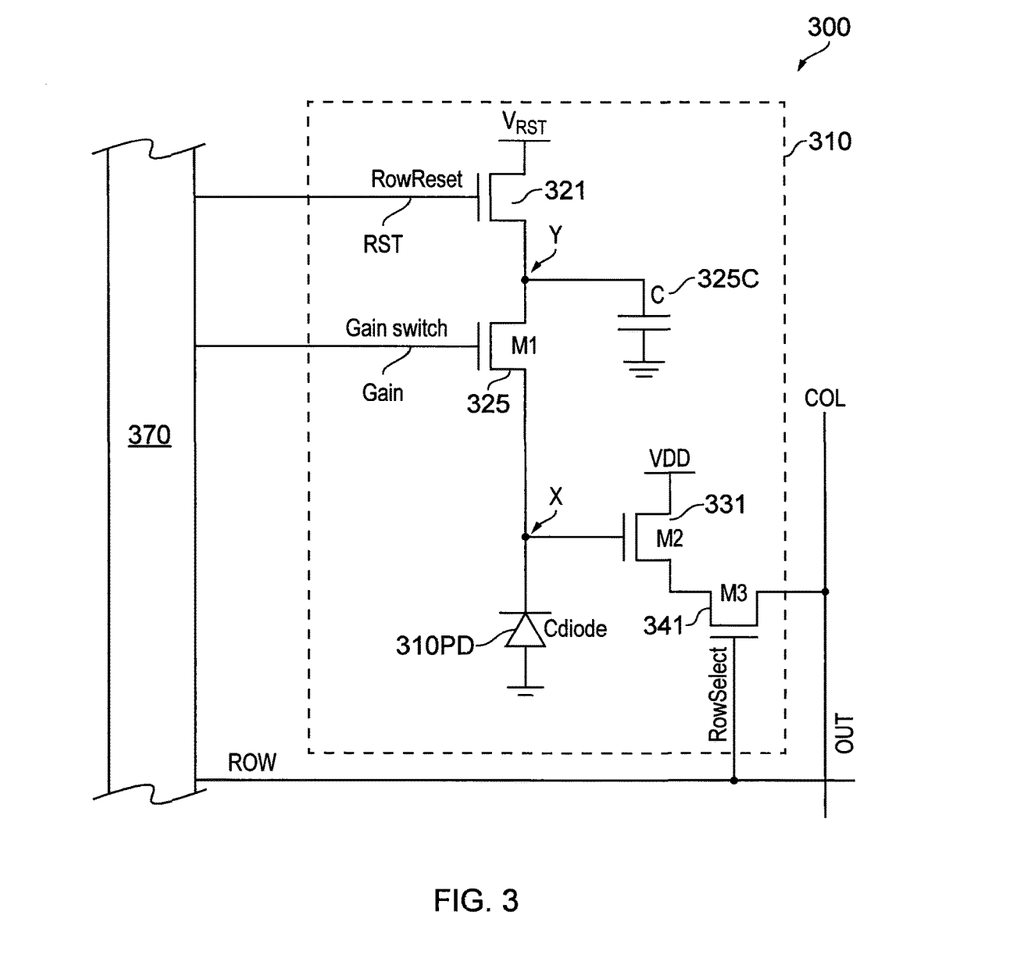
FIG. 3 is a schematic circuit diagram of a pixel element according to an embodiment of the present invention.

FIG. 3 is a schematic circuit diagram showing a portion of a detector device 300 according to a further embodiment of the present invention. Like features of the embodiment of FIG. 3 to those of the embodiment of FIG. 2 are shown with like reference signs prefixed numeral 3 instead of numeral 2.

In the embodiment of FIG. 3, the gain control transistor device 325 is connected between the row reset transistor device 321 and photodiode device 310PD. The capacitor device 325C is coupled to a node Y between the row reset transistor device 321 and the gain control transistor device 325. It is to be understood that this arrangement has the advantage that the photodiode device 310PD is only coupled to a single transistor drain or source, in the present embodiment the drain of gain control transistor device 325. Consequently, leakage of charge to or from the photodiode device 310PD may be reduced compared with the embodiment of FIG. 2.

It is to be understood that, in use, if it is required to operate the pixel element 310 in the high gain mode the potential at node X may be reset to $V_{RST}$ by setting both the row reset control line RST and gain control line GAIN of the pixel element 310 high for a predetermined period before returning both control lines RST, GAIN to the low state. The potential at node Y is also set to $V_{RST}$ when this operation is performed, reducing the potential across the gain control transistor device 325 following the reset operation. As described above, this feature has the advantage of reducing leakage of current across the gain control transistor device 325 when the device 325 is in the open state or condition.

This process is illustrated by the timing diagram of FIG. 4(a). At time t=t0 row select line ROW is set high and the potential at node X is read out via column readout line COL.

Subsequently at time t=t1 the row select line ROW is set low and both the row reset signal line RST and the gain control signal line GAIN are set high. Subsequently at time t=t2, both the row reset signal line RST and the gain control signal line GAIN are set low and the integration period commences. At time t=t3, at the end of the integration period, the row select signal line ROW is set high and the potential at node X is read out via column readout line COL. The sequence of events from time t=t0 then repeats. It is to be understood that time t1 and (t2−t1) may each be around 10 microseconds although other values may also be useful. The integration period may be any suitable period such as 1 millisecond, or any other suitable value which may be larger or smaller than 1 millisecond.

In some alternative embodiments, the row reset signal line RST may be maintained high throughout operation in the high gain mode. This has the advantage that the potential at node Y will remain high throughout the integration period, and will not fall with time due to discharge of capacitor device 325C due to leakage current. It is to be understood that by keeping the row reset control line RST high, row reset transistor device 321 remains closed therefore maintaining node Y at potential $V_{RST}$. The gain control transistor device 325 can then be selectively closed by means of gain control signal line GAIN in order to reset the potential at node X to the potential $V_{RST}$. Other arrangements may also be useful in addition or instead in some embodiments.

If it is required to operate the pixel element 310 in the low gain mode, the potential at node X is reset to $V_{RST}$, again by setting both the row reset control line RST and gain control line GAIN of the pixel element 310 high. The row reset control line RST is returned to the low state once the predetermined period has expired, but the gain control line GAIN remains high throughout operation in the low gain mode so as to maintain the capacitor device 325C connected to the photodiode device 310PD. At the end of the integration period, which commences when the row reset control line RST is returned to the low state, the potential at node X is again read out via column readout line COL.

FIG. 4(b) illustrates the timing of signals during operation of the pixel element 310 in the low gain mode. At time t=t0 row select line ROW is set high and the potential at node X is read out via column readout line COL, for example via a sample-and-hold circuit. Gain control signal line GAIN remains high throughout operation of the pixel element 310 in the low gain mode.

Subsequently at time t=t1 the row select line ROW is set low and the row reset signal line RST is set high.

Figure 4:
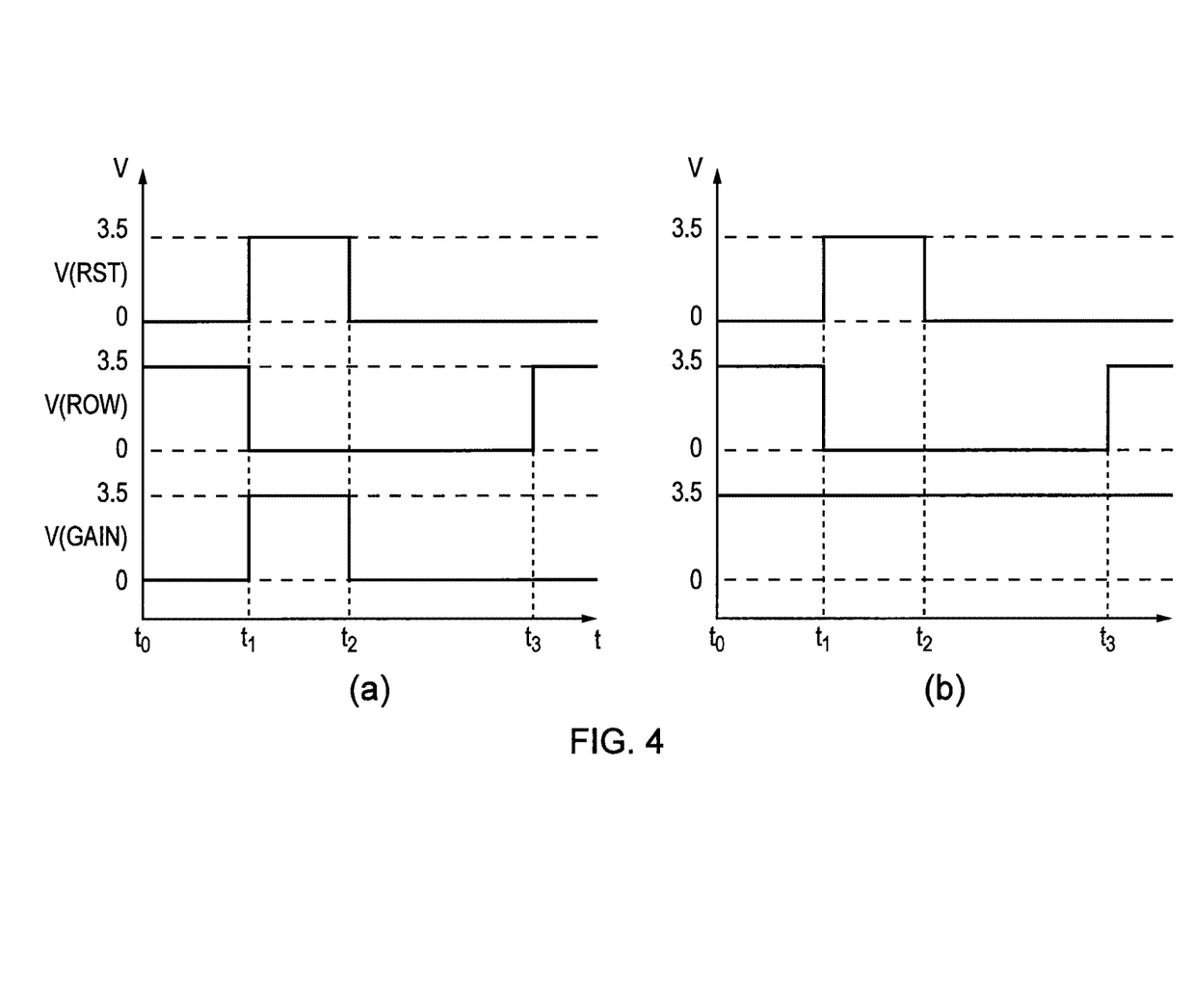
FIG. 4 shows timing diagrams illustrating operation of a pixel element in (a) a high gain mode and (b) a low gain mode.
Figure 5:
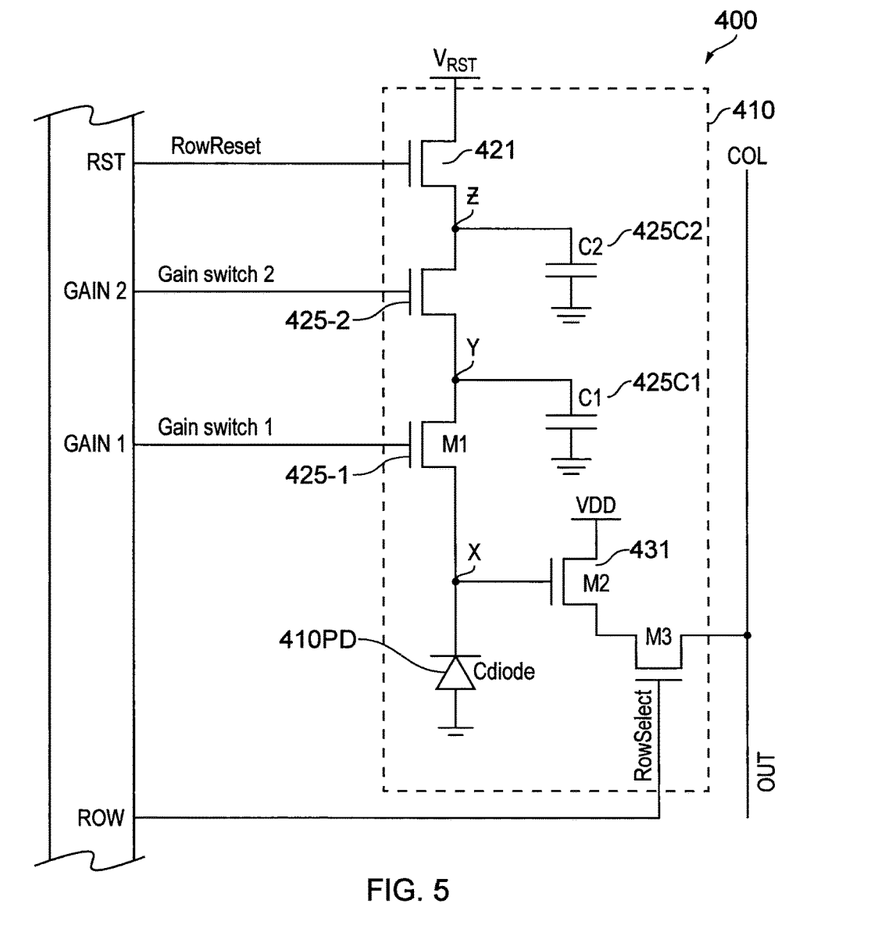
FIG. 5 is a schematic circuit diagram of a pixel element according to a further embodiment of the present invention.

Subsequently, at time t=t2, the row reset signal line RST is set low and the integration period commences. At time t=t3 the integration period ends and the sequence of events from time t=t0 repeats. That is, the gain control signal line GAIN remains high, the row select signal line ROW is set high and the potential at node X is read out via column readout line COL. FIG. 5 is a schematic illustration of a portion of a detector device 400 according to a further embodiment of the present invention. Like features of the embodiment of FIG. 5 to those of the embodiment of FIG. 4 are shown with like reference signs prefixed numeral 4 instead of numeral 3. The detector device 400 of FIG. 5 has the feature that the pixel element 410 may be operated with one of three different effective node capacitances.

In the embodiment of FIG. 5, the pixel element 410 has first and second gain control transistor devices 425_1, 425_2. A source terminal of each of the devices 425_1, 425_2 is coupled to a respective first or second capacitor device 425C1, 425C2 whilst a gate terminal of each device is coupled to a respective first or second gain control line GAIN1, GAIN2. In the embodiment of FIG. 5 the capacitor devices 425C1, 425C2 are coupled between the respective source terminals of the transistor devices 425_1, 425_2 and ground.

It is to be understood that the pixel element 410 is configured to allow the potential at node X, corresponding to the potential of the cathode of the photodiode device 410PD, to be reset to potential $V_{RST}$ by setting reset control line RST high, together with the first and second gain control lines GAIN1, GAIN 2.

In order to operate the pixel element 410 with the highest gain, the first gain control device 425_1 is opened after the potential at node X has been set to $V_{RST}$, i.e. gain control signal line GAIN1 is set low whilst the reset signal line RST and second gain control line GAIN 2 are set low. This step marks the start of the integration period. It is to be understood that the second gain control signal line GAIN2 and further optionally the reset signal line RST may remain high during the integration period in some embodiments. It is to be understood that by maintaining the second gain control signal line GAIN2 and reset signal line RST high during the integration period, the potential at node Y remains substantially equal to $V_{RST}$ and any drop in potential at node Y due to leakage of charge from the capacitor devices 425C1, 425C2 may be prevented.

In order to operate the pixel element 410 with a lower gain (but not the lowest gain), the first gain control device 425_1 remains closed after the potential at node X has been set to $V_{RST}$, i.e. gain control signal line GAIN1 remains high, whilst the reset signal line RST and second gain control signal line GAIN2 are set low, marking the start of the integration period. The first capacitor device 425_1 therefore remains connected to node X during the integration period whilst the second capacitor device 425_2 is disconnected from node X. It is to be understood that the reset signal line RST may remain closed during the integration priod in order to maintain the potential at node Z substantially equal to the reset potential $V_{RST}$.

In order to operate the pixel element 410 with the lowest gain, the first and second gain control devices 425_1, 425_2 remain closed after the potential at node X has been set to $V_{RST}$, i.e. the first and second gain control signal lines GAIN1, GAIN2 remain high, whilst the reset signal line RST is set low, marking the start of the integration period. The first and second capacitor devices 425C1, 425C2 therefore remains connected to node X during the integration period.

As described above, some embodiments of the present invention have the feature that leakage of charge across a gain control transistor device that is closed following a reset operation may be reduced. This in turn may have the effect of increasing the signal to noise ratio of images captured by means of a detector device according to an embodiment of the present invention, and/or improving a correspondence between the potential across a photodiode of a pixel and the cumulative amount of radiation incident on the photodiode since a reset operation was performed.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. A detector comprising at least one detector element, the at least one detector element comprising:
  a photodiode element operable to generate charge carriers in response to incident radiation, the detector being configured to generate a signal indicative of a cumulative amount of charge carriers generated by the photodiode element during an integration period;
  a reset switch element configured to couple the photodiode element to a reset potential;
  a charge storage reservoir; and
  a gain control switch element configured to couple the charge storage reservoir to the photodiode element,
  wherein the detector is configured to operate in a selected one of a high gain mode and a low gain mode, wherein in each mode the detector is configured to perform a reset operation in which the reset switch element and the gain control switch element are closed in order to couple the charge storage reservoir and the photodiode element to the reset potential, the detector being configured to open the gain control switch element following a reset operation in dependence on whether the charge storage reservoir is to remain connected to the photodiode element during the integration period,
  wherein if the low gain mode is the selected mode the detector is configured to cause the gain control switch element to remain closed during the integration period, and if the high gain mode is selected the detector is configured to cause the gain control switch element to remain open during the integration period, and
  wherein the gain control switch element is provided in a flow path of current between the reset switch element and the photodiode element.

2. The detector according to claim 1, further comprising a plurality of gain control switch elements each having a respective charge storage reservoir associated therewith, the detector being configured to connect one or more of the charge storage reservoirs to the photodiode element via the corresponding gain control switch element.

3. The detector according to claim 2, configured wherein when a reset operation is performed, a plurality of said plurality of gain control switch elements are closed in order to couple the respective charge storage reservoirs to the photodiode element and to the reset potential, the detector being configured to open one or more of the gain control switch elements following a reset operation in dependence on whether the charge storage reservoir associated with a given gain control switch element is to remain connected to the photodiode element during the integration period.

4. The detector according to claim 1, further configured to read out a signal from the at least one detector element indicative of a cumulative amount of charge carriers generated by the photodiode element during the integration period.

5. The detector according to claim 4, wherein the detector comprises at least one readout signal line, the at least one detector element comprising a switch element configured to apply, to one said at least one readout signal line, a signal indicative of a cumulative amount of charge carriers generated by the photodiode element during the integration period.

6. The detector according to claim 1, wherein the at least one detector element comprises a plurality of detector elements.

7. The detector according to claim 6, wherein the plurality of detector elements comprise a plurality of rows of detector elements, each row comprising a plurality of detector elements forming a corresponding plurality of columns.

8. The detector according to claim 7, wherein each column of detector elements is provided with a corresponding column readout signal line, the detector elements of a given column being configured to apply to the column readout signal line a signal indicative of a cumulative amount of charge carriers generated by the photodiode element during the integration period.

9. A method of detecting radiation or particles via a detector, the method comprising:
  generating charge carriers in a photodiode element, and generating a signal indicative of a cumulative amount of charge carriers generated by the photodiode element during the integration period;
  operating the detector in a selected one of a high gain mode and a low gain mode, wherein in each mode the method comprises:

performing a reset operation in which a reset switch element and a gain control switch element are closed in order to couple a charge storage reservoir and the photodiode element to a reset potential, the method comprising opening the gain control switch element following the reset operation in dependence on whether the charge storage reservoir is to remain connected to the photodiode element during the integration period, wherein if the low gain mode is the selected mode the gain control switch element remains closed during the integration period, and if the high gain mode is selected the gain control switch element remains open during the integration period; and providing the gain control switch element in a flow path of current between the reset switch element and the photodiode element.

\* \* \* \* \*